United States Patent [19]

Barnes et al.

[11] Patent Number: 5,679,215
[45] Date of Patent: Oct. 21, 1997

[54] METHOD OF IN SITU CLEANING A VACUUM PLASMA PROCESSING CHAMBER

[75] Inventors: Michael S. Barnes, San Francisco; Arthur Kenichi Yasuda, Belmont, both of Calif.

[73] Assignee: Lam Research Corporation, Fremont, Calif.

[21] Appl. No.: 580,723

[22] Filed: Jan. 2, 1996

[51] Int. Cl.$^6$ .......................................................... B44C 1/22
[52] U.S. Cl. .................... 156/646.1; 156/643.1; 134/1.1; 134/22.1
[58] Field of Search ........................ 216/67; 156/646.1, 156/643.1; 134/1.1, 22.1

[56] References Cited

U.S. PATENT DOCUMENTS

| | | | |
|---|---|---|---|
| 4,605,479 | 8/1986 | Faith, Jr. | 204/192 |
| 4,657,616 | 4/1987 | Benzing et al. | 156/345 |
| 4,786,352 | 11/1988 | Benzing | 156/345 |
| 4,960,488 | 10/1990 | Law et al. | 156/643 |
| 5,089,084 | 2/1992 | Chhabra et al. | 156/646 |
| 5,198,634 | 3/1993 | Mattson et al. | 219/121.43 |
| 5,219,791 | 6/1993 | Freiberger | 437/195 |
| 5,281,302 | 1/1994 | Gabric et al. | 156/643 |
| 5,308,950 | 5/1994 | Ramm et al. | 219/121.43 |
| 5,326,723 | 7/1994 | Petro et al. | 437/192 |

FOREIGN PATENT DOCUMENTS 6-338478  12/1994  Japan ........................... H01L 21/302

*Primary Examiner*—R. Bruce Breneman
*Assistant Examiner*—Michael E. Adjodha
*Attorney, Agent, or Firm*—Lowe, Price, LeBlanc & Becker

[57] ABSTRACT

Surfaces having semiconductor oxides, metal oxides and hydrocarbons deposited thereon in a vacuum plasma processing chamber are in situ cleaned by introducing water vapor and $SF_6$ and/or $NF_3$ gas in the presence of a plasma discharge. The vapor and gas react to form gaseous HF, and an acidic gas including at least one of $H_2SO_4$ and $HNO_3$. The discharge ionizes and dissociates the HF and acidic gases to form gaseous reactants for the deposits. The reactants chemically react with the deposits, including the oxides and hydrocarbons, to vaporize these deposits. The vaporized deposits are pumped out of the chamber by the same pump which normally evacuates the chamber to a vacuum. Oxygen and/or $H_2O_2$ vapors are introduced in the presence of the plasma to additionally clean the surfaces.

20 Claims, 1 Drawing Sheet

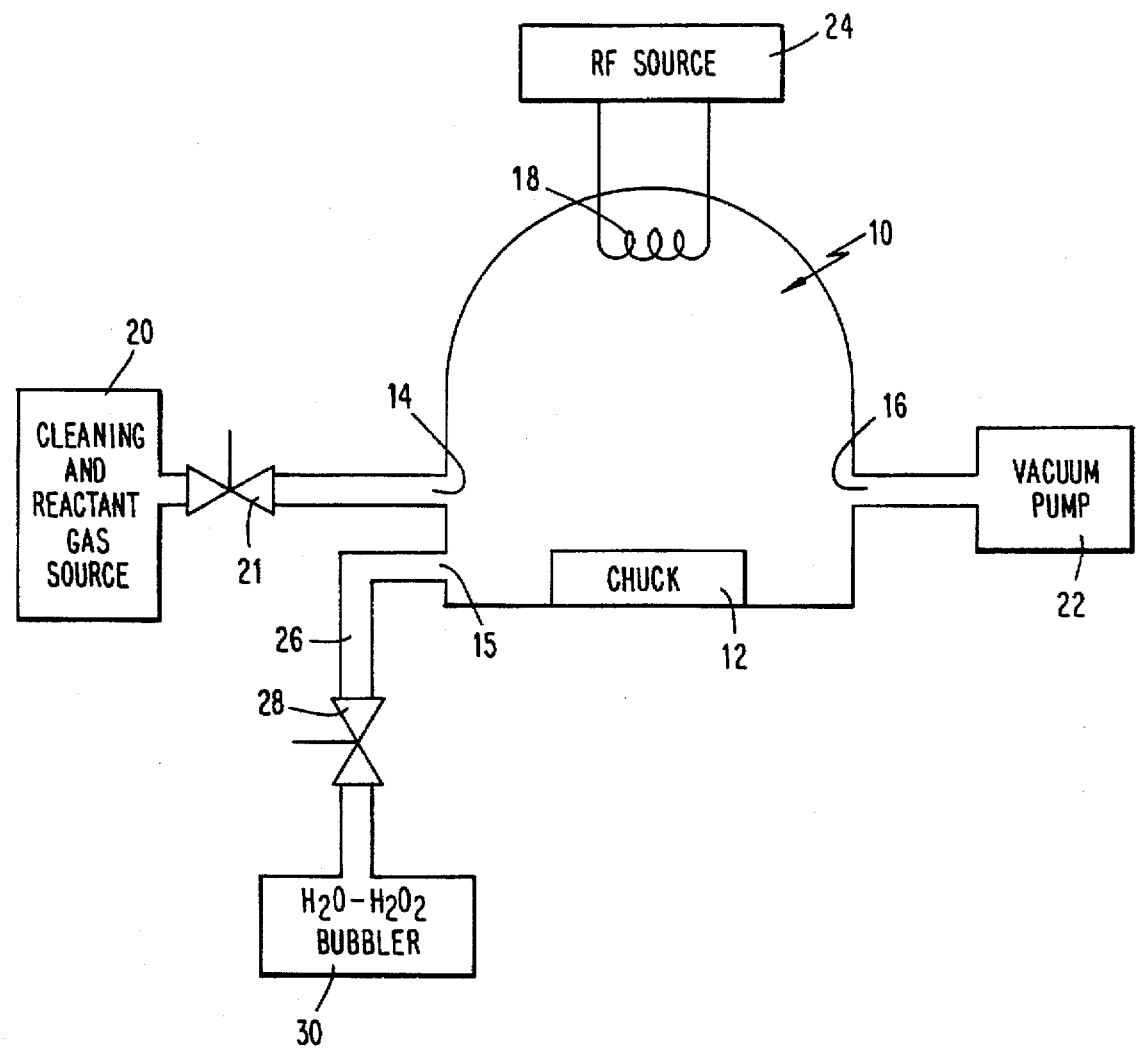

5,679,215

METHOD OF IN SITU CLEANING A VACUUM PLASMA PROCESSING CHAMBER

FIELD OF INVENTION

The present invention relates generally to a method of in situ cleaning vacuum plasma processing chambers and, more particularly, to such a method wherein water vapor and at least one of sulphur hexafluoride ($SF_6$) and nitrogen trifluoride ($NF_3$) is introduced into the chamber and subjected to a plasma discharge, to provide reactants with material to be removed from surfaces within the vacuum chamber.

BACKGROUND ART

In vacuum plasma processing, a work piece, such as a semiconductor, dielectric, or metal substrate, is subjected to reactant gases in the presence of a plasma in a vacuum processing chamber. The work piece is either etched or has material deposited thereon by the reactant gases introduced into the chamber in the presence of the plasma.

In both the etching and deposition processes, unwanted particles are produced which may be deposited on the work piece, to frequently significantly adversely affect process yields. The number of unwanted particles is usually a function of the degree of contamination of the vacuum plasma processing chamber from prior processing operations. The workpieces to be coated and/or etched must remain free from contamination. In addition, interior surfaces of the reaction chambers, e.g., the chamber walls and surfaces of devices in the chamber, must also be very clean. If the surfaces of the plasma processing chamber interior are not free of contaminants, deposits on these surfaces are likely to flake off and/or be vaporized during work piece processing to contaminate the work piece.

Typically the interior surfaces of vacuum plasma processing chambers have been cleaned manually. Manual cleaning requires opening the chamber and mechanically removing the contaminants from the surfaces. There are obvious disadvantages associated with such manual operations, relating, for example, to down time of the vacuum plasma processing chamber, cost and mechanical wear of devices having surfaces requiring cleaning.

To avoid the problems associated with manual cleaning of vacuum plasma processing chambers, gaseous cleaning agents have been introduced into the chamber in the presence of a plasma during a cleaning cycle. The cleaning agents are ionized and dissociated by the plasma to form reactants for contaminants on interior surfaces of the vacuum plasma processing chamber. The prior art reports the use of $NF_3$ and $SF_6$ as reactant gases that are disassociated by a plasma discharge into atoms and ions that react with contaminants on the vacuum plasma processing chamber interior surfaces. However, the dissociated and ionized forms of many of these gases do not react with hydrocarbons, semiconductor oxides and metal oxides, particularly silicon and tungsten oxides, which are frequently present on interior surfaces of a vacuum plasma processing chamber processing semiconductors or glass substrates. Hydrocarbons are also frequently deposited on interior surfaces of vacuum plasma chambers that process semiconductor wafer workpieces. This is because hydrocarbon containing photoresist layers are usually deposited on and removed from semiconductor wafers during processing in the chamber. These hydrocarbons in the photoresist layers are vaporized to become volatile chamber surface deposits that contaminate wafers that are subsequently processed. $NF_3$ is disadvantageous because it is expensive, volatile, and difficult to handle.

Benzing et al., U.S. Pat. No. 4,657,616 and Benzing, U.S. Pat. No. 4,786,352 disclose plasma discharges for in situ cleaning of a low pressure chemical vapor deposition epitaxy tube or bell jar with a gas or gas mixture, such as $CF_4$, $CF_4+O_2$, $C_2F_6+O_2$, $SF_6$ or $NF_3$. Etching species created by dissociation in the presence of the plasma discharge react with material deposited on interior surfaces of the tube or bell jar to form volatile products that are pumped out of the tube or bell jar by a vacuum pumping system.

Law et al., U.S. Pat. No. 4,960,488 discloses a combined method of 1) depositing a layer of silicon-containing material on a wafer in a vacuum plasma processing chamber followed by repeated cycles and 2) cleaning the chamber by (a) spacing apart a gas inlet manifold electrode and a wafer supporting electrode and (b) supplying fluorinated gas, $NF_3$, to the chamber while (c) applying r.f. power between a gas inlet manifold electrode and a wafer supporting electrode. The $NF_3$ gas is supplied to the chamber after $C_2F_6$ and $O_2$ are introduced in the presence of the plasma discharge.

Gabric et al., U.S. Pat. No. 5,281,302 discloses an in situ cleaning method wherein an ozone/oxygen mixture is added to at least one fluorinated carbon source in the presence of a plasma discharge. The reference indicates $SF_6$ and $NF_3$ have previously been used for in situ cleaning, with disadvantageous results for interior chamber surfaces.

Petro et al., U.S. Pat. No. 5,326,723 discloses a process of cleaning chemical vapor deposition chamber involved in tungsten chemical vapor deposition semiconductor wafer fabrication wherein $NF_3$ and then hydrogen are introduced into the chamber in the presence of a plasma.

SUMMARY OF THE INVENTION

The foregoing references disclose cleaning interior chamber surfaces by dissociating various gases with a plasma. None of these references discloses using water vapor and/or dissociating water vapor by a plasma discharge. We have realized that cleaning by introducing water vapor and at least one of $SF_6$ and $NF_3$ into a vacuum plasma processing chamber in the presence of a plasma discharge is highly desirable because water is inexpensive, easy to handle, is easily vaporized in a bubbler at room temperature, and can be dissociated to form reactants for oxides and hydrocarbons deposited on the chamber interior surfaces. While water vapor has been suggested in the past for cleaning, it has not, to our knowledge, been suggested for in situ cleaning of chamber surfaces in the presence of a plasma discharge, nor has it been suggested with $SF_6$ or $NF_3$.

In particular, Faith, Jr., U.S. Pat. No. 4,605,479 discloses a method of cleaning an ohmic contact between a metalization layer and a substrate in a closed system, avoiding any exposure to the atmosphere. The contact is cleaned by reducing the pressure in the cleaning chamber to remove residual air and moisture, after which a hydrogen fluoride/water vapor mixture is introduced into the chamber. The hydrogen fluoride/water mixture is at least 25% by weight HF and, preferably, is full strength commercial unbuffered HF, which is about 49% by weight HF. The percent of HF can be increased to 100%, and the etchant is stated to preferably contain some water vapor to enhance cleaning. A 49%/ 51% mixture is said to be suitable because the two components volatilize in that proportion.

Chhabra et al., U.S. Pat. No. 5,089,084 and Freiberger, U.S. Pat. No. 5,219,791 deal with the general state of the art by disclosing an apparatus for and method of etching and washing plural integrated circuit wafers. One step involves turning on nitrogen, water and hydrogen fluoride sources so a moisturized etch vapor is supplied to an etch chamber section. Freiberger discloses precleaning a semiconductor device in liquid solution acids, such as HF and HCl.

The prior art also reports the use of gaseous hydrogen in the presence of a plasma discharge as a cleaning agent; see Ramm et al., U.S. Pat. No. 5,308,950. However, gaseous hydrogen is very dangerous and, therefore, requires expensive handling techniques.

It is, accordingly, an object of the present invention to provide a new and improved in situ method of cleaning interior surfaces of a vacuum plasma processing chamber.

An additional object of the invention is to provide a new and improved method of cleaning the interior of a vacuum plasma processing chamber with vapors that are dissociated and ionized by a plasma discharge to form reactants with metal oxides and chlorides, particularly silicon dioxide, tungsten oxides, silicon chlorides, and tungsten chlorides, as well as hydrocarbons, on interior surfaces of the chamber.

An additional object of the invention is to provide a new and improved method of cleaning interior surfaces of a vacuum plasma processing chamber wherein a very inexpensive and easily handled vapor reactant is introduced into the vacuum chamber.

The above and still further objects, features and advantages of the present invention will become apparent upon consideration of the following detailed description of several specific embodiments thereof, especially when taken in conjunction with the accompanying drawing.

BRIEF DESCRIPTION OF THE DRAWING

The single FIGURE schematic diagram of apparatus for performing the method.

DESCRIPTION OF THE PREFERRED EMBODIMENT

In accordance with one aspect of the invention, an improved method of in situ removing deposits from interior surfaces of a vacuum plasma processing chamber comprises causing water vapor and at least one of $NF_3$ and $SF_6$ to be in the chamber in vacuo in the presence of an r.f. plasma discharge to form vaporous reactants for the deposits. The vaporous reactants will react with the deposits to form vaporous—reaction products, which will be either consumed or pumped from the vacuum chamber in vacuo.

In a preferred embodiment, deposits are in situ removed from surfaces in a vacuum plasma processing chamber, wherein the surfaces have at least one of a metal oxide and hydrocarbon deposited thereon. The method comprises causing water vapor and at least one of $SF_6$ and $NF_3$ gas to be in the chamber in the presence of an r.f. plasma discharge while the chamber is in vacuo. The plasma discharge and the vacuum in the chamber are such that (a) the vapor and gas react to form, as vaporous reaction products, (i) HF and (ii) acid including at least one of $H_2SO_4$ and $HNO_3$, and (b) the vaporous reaction products are ionized and dissociated to form vaporous reactants for the deposits. The vaporous reactants chemically react with materials, including at least one of the metal oxide and the hydrocarbon, in the deposits, so the deposits become vaporized. The vaporized deposits, including at least one of the oxide and the hydrocarbon, are pumped from the chamber.

The method can be performed so $SF_6$ is supplied without $NF_3$ or $NF_3$ is supplied without $SF_6$. Typically the method is performed by supplying only one of $SF_6$ or $NF_3$.

It is believed that partial reactions that will take place in the presence of the plasma in forming the actual effective etchant gases are:

1) $4H_2O+SF_6 \rightarrow H_2SO_4+6HF$
2) $3H_2O+NF_3 \rightarrow HNO_3+3HF+H_2$ Vaporous hydrogen peroxide ($H_2O_2$) is preferably added to the water vapor so the concentration of $H_2O_2$ in the $H_2O$ is about 6–10%. The partial reactions of the $H_2O_2$ with $SF_6$ and $NF_3$ are: $4H_2O_2+SF_6 \rightarrow H_2SO_4+6HF+2O_2$, and $2H_2O_2+NF_3 \rightarrow HNO_3+3HF+2O_2$ Gaseous oxygen ($O_2$) can also be added as an original reactant.

The r.f. plasma discharge will dissociate gaseous HF to form gaseous $H^+$, $F^+$ and $F^-$. The plasma discharge will also ionize and dissociate the $H_2SO_4$ and $HNO_3$ to form gaseous (1) $H_2$ molecules, (2) $SO_4^-$ ions, (3) $H^+$ ions and (4) $NO_3^-$ ions. The plasma will partially dissociate the gaseous $SO_4^-$ and $NO_3^-$ ions to respectively form vaporous $SO_2$ and $NO_2$, NO which will react with silicon salts (e.g., SiC), tungsten chlorides, e.g., $WCl_2$, $WCl_4$ and/or metal oxide deposits (e.g., $SiO_2$ or $WO_3$) on the chamber interior surfaces. The vaporous $H_2$ molecules and $H^+$ ions will react with and vaporize the solid hydrocarbon deposits while the vaporous $SO_4^-$ and $NO_3^-$ ions will react with and vaporize the solid oxide deposits, particularly the $SiO_2$ deposits. The amount of HF produced by the reaction will be consumed in chemical reactions with deposits on the chamber surfaces so the HF does not remain resident in the chamber and does not flow through a pump which removes the vapor reaction products from the chamber.

Hence, using water vapor and at least one of vaporous $SF_6$ or $NF_3$ in the presence of a plasma discharge during standard operating conditions of a plasma processing chamber causes etching and removal of organic and many oxide surface deposit residues typically responsible for producing particles in plasma process chambers during normal wafer etching and deposition operations. Moreover, the use of water vapor in combination with $SF_6$ and/or $NF_3$ avoids the corrosiveness that HF would have on parts connected to an inlet port of the chamber if the HF were introduced directly.

The $O_2$ in the chamber, as a result of being directly introduced or as a result of $H_2O_2$ being supplied to the chamber, is dissociated by the plasma into oxygen ions that are particularly useful in removing the very stable and difficult to remove tungsten and silicon chlorides. The dissociated oxygen ions react with the tungsten and silicon chlorides to produce vaporous tungsten oxychloride and silicon oxychloride, both of which can be removed from the vacuum chamber in the same way that other vaporous reaction products are removed.

In the standard r.f. plasma discharge environment, the $SF_6$ and the $NF_3$ will be present in their ionic components. The gas and water vapor will facilitate reactions with deposits on the interior chamber surfaces. The water vapor or water vapor, hydrogen peroxide vapor mixture may be introduced simultaneously with the $SF_6$ and/or $NF_3$ gases, or the vapor may be introduced before or after the fluoride gas. Gaseous oxygen can be introduced simultaneously with the other reactants or at different times. When the reactants are introduced at different times they are usually repeatedly cycled into the chamber so all the reactants are simultaneously in the chamber and subjected to the radio frequency excitation which establishes the plasma that produces sufficient heat radiation and other energy to dissociate the reactants.

The process has particular use for in situ cleaning of plasma etch and deposition tools used, for example, in semiconductor and active matrix liquid crystal device (AMLCD) processing. The described cleaning will eliminate manual cleaning of vacuum plasma process chambers or significantly extend the periods between manual cleaning of these chambers without the problems of prior art in situ techniques.

The described in situ cleaning treatment may be utilized when excessive deposits are found, using conventional means. Thereafter, the process is conducted until a technician determines that the interior of the low pressure chemical vapor deposition chamber is free from deposits. This determination can be made by an optical emission spectrometer responsive to radiation propagated through a window of the chamber.

Alternatively, the vacuum chamber may be cleaned on a specific schedule to eliminate the necessity for investigating the state of the chamber interior surfaces. This procedure eliminates one step while assuring cleanliness of the chamber interior.

Reference is now made to the figure wherein a conventional vacuum plasma processing chamber 10 is illustrated as including chuck 12, gaseous inlet port 14, vacuum outlet port 16 and excitation coil 18. In normal operation, a semiconductor wafer, dielectric sheet or metal plate is fixed in place as a work piece on chuck 12. Reactant gas is supplied from source 20 to the interior of chamber 10, maintained at a vacuum of about 50 Torr by connecting port 16 to vacuum pump 22. Coil 18 is connected to a suitable r.f. source 24, typically having a frequency of 13.56 mHz. Coil 18 responds to r.f. source 24 to produce an r.f. electromagnetic field in chamber 10. The r.f. electromagnetic field interacts with the gases supplied to the interior of chamber 10 via port 14, to dissociate and ionize the gases to form an r.f. plasma including atoms and ions that are either deposited on or etch the work piece held in situ on chuck 12. The plasma can also be excited by another suitable r.f. excitation arrangement, e.g., an electrode structure or by a cyclotron resonance mechanism.

Typically, workpieces are automatically loaded onto and removed from chuck 12 by an automatic transport mechanism (not shown). As a result of processing of the workpieces on chuck 12 by the plasma, by-products are usually volatilized, i.e., evaporated, from the work piece. The vapor materials alight on surfaces in the interior of chamber 10, to contaminate these surfaces. Because of the vacuum, plasma and heat within chamber 10, the contaminants on the surfaces are frequently volatilized during subsequent work piece processing operations, to cause work piece contamination. Among the contaminants which are volatilized from the work piece and coat surfaces in chamber 10 are hydrocarbons present in resist compounds on the workpieces and metal oxides, particularly silicon dioxide ($SiO_2$) and tungsten oxide ($WO_3$), and metal chlorides, particularly silicon chloride and tungsten chloride.

In accordance with the present invention, many of the contaminants in chamber 10 which have a tendency to be volatilized and deposited on surfaces in chamber 10 during processing operations of the substrates on chuck 12 are volatilized during a cleaning operation, through the introduction of suitable gases and vapors into chamber 10 via ports 14 and 15. The gases and vapors are in the presence of the r.f. plasma discharge established by r.f. excitation of coil 18. The volatilized contaminants are removed from the interior of chamber 10 by vacuum pump 22 via port 16 during the same cleaning operation. Since the cleaning operation involves supplying water vapor or water vapor and hydrogen peroxide vapor to the interior of chamber 10, port 15 is connected via conduit 26 and valve 28 to bubbler 30.

Liquid water or a mixture of liquid water and hydrogen peroxide is loaded into bubbler 30. When valve 28 is open and the interior of bubbler 30 is subjected to the vacuum inside chamber 10, the liquid in the bubbler is vaporized without heat being added. Alternatively, bubbler 30 can be replaced by a gas injector loaded with a liquid $H_2O$–$H_2O_2$ mixture. The injector atomizes the liquid which becomes a vapor when it is in the vacuum environment resulting from chamber 10. The $SF_6$, $NF_3$ and $O_2$ (if used) are selectively supplied to chamber 10 from one or more gaseous supply sources, such as source 20; source 20 is connected to chamber 10 via valve 21 and port 14. Typically each source connected to port 14 is connected to that port through an individual valve (not shown).

After chamber 10 has conventionally processed a predetermined number of workpieces (e.g., wafers) or after measuring instruments (not shown) indicate there are excessive contaminants in chamber 10, the cleaning operation is initiated. The first cleaning operation steps are to remove all workpieces that have been processed or are to be processed from the interior of chamber 10 and then to isolate sources of the conventional plasma forming gases from conduits connected to port 14 by closing valve 21. Then conduit 26 bubbler 30 is connected to port 15 by opening valve 28. Simultaneously, a source 20 containing $SF_6$ or $NF_3$ is connected to port 14 by opening valve 21. Since valve 28 is open, the $H_2O$ vapor or $H_2O$ and $H_2O_2$ mixture vapor from bubbler 30 flow via line 26 and port 15 into chamber 10 while source 24 supplies r.f. energy to coil 18. While $H_2O$ or $H_2O$ and $H_2O_2$ vapors are flowing through port 15 the $SF_6$ or $NF_3$ gases as well as other gases (e.g., $O_2$) are flowing through port 14. Alternatively, valve 28 is sequentially and cyclically opened and closed between the times when valve 21 is sequentially and cyclically opened and closed. If plural gas sources 20 are connected to port 14 they can be simultaneously or sequentially and cyclically connected to this port.

Alternatively, valve 28 is replaced by a three-way valve (not shown) having first and second inlet ports respectively connected to bubbler 30 and a gas bottle source and an outlet port connected to line 26 so gas flows, at any one time, from only one of bubbler 30 and the gas bottle into chamber 10 via line 26 and port 15. The three-way valve is sequentially and cyclically activated so the gas in the bottle is first introduced into chamber 10 while no vapor flows from bubbler 30 into the chamber and then vapor flows from bubbler 30 into the chamber while no gas flows into the chamber. Source. 24 supplies coil 18 with r.f. energy to energize the plasma in chamber 10 when vapors from both bubbler 30 and bottle 32 are resident in the chamber. It is also possible to supply both $SF_6$ and $NF_3$ from separate sources to the interior of chamber 10 in the presence of water vapor or the water/hydrogen peroxide vaporous mixture and the r.f. energy.

The water vapor or $H_2O$–$H_2O_2$ vapor, $SF_6$ or $NF_3$ and possibly introduced $O_2$ will react and form gaseous compounds that dissociate in response to the heat and energy of the r.f. plasma discharge as described supra. The dissociated products chemically react with the contaminants deposited on the interior surfaces of chamber 10 to form vapors that are sucked from the chamber via port 16 by pump 20. The chemical reaction of the dissociated HF with the contaminants consumes the HF and turns it into silicon and tungsten by-products so virtually no HF is pumped from chamber 10.

After the interior surfaces of chamber 10 have been cleaned by the reaction of the vaporous $H_2O$ or the $H_2O$–$H_2O_2$ vaporous mixture and one or both of gaseous $SF_6$ and $NF_3$ and possibly introduced $O_2$ in the presence of the plasma discharge, a conventional purging gas is introduced into chamber 10 while one or more dummy, i.e., seasoning, wafers are sequentially loaded into chuck 12. Then valve 28 is closed, valve 21 is open and new workpieces to be processed are clamped onto chuck 12.

While there have been described and illustrated several specific embodiments of the invention, it will be clear that variations in the details of the embodiments specifically described may be made without departing from the true spirit and scope of the invention as defined in the appended claims.

We claim:

1. A method of in situ cleaning deposits from interior surfaces forming a vacuum plasma processing chamber, the surfaces having at least one of an oxide and hydrocarbon deposited thereon, comprising causing water vapor and at least one of $SF_6$ and $NF_3$ gas to be in the chamber in the presence of a plasma discharge while the chamber is in vacuo, the plasma discharge and the vacuum in the chamber being such that (a) the vapor and gas react to form, as gaseous reaction products, (i) HF and (ii) acid including at least one of $H_2SO_4$ and $HNO_3$, and (b) the vaporous reaction products are ionized and dissociated to form vaporous reactants for the deposits, the vaporous reactants chemically reacting with materials, including at least one of the oxide and the hydrocarbon, in the deposits, so the deposits become vaporized, and pumping the vaporized deposits, including at least one of the oxide and the hydrocarbon, from the chamber.

2. The method of claim 1 wherein the $SF_6$ is supplied without the $NF_3$.

3. The method of claim 1 wherein the $NF_3$ is supplied without the $SF_6$.

4. The method of claim 1 further including introducing vaporous $H_2O_2$ into the chamber simultaneously with the water vapor.

5. The method of claim 4 wherein there is a partial reaction in the chamber in accordance with at least one of $4H_2O_2 + SF_6 \rightarrow H_2SO_4 + 6HF + O_2$, and $H_2O_2 + NF_3 \rightarrow HNO_3 + HF + O_2$.

6. The method of claim 1 further including introducing gaseous $O_2$ into the chamber in the presence of the plasma, the plasma dissociating the introduced gaseous $O_2$.

7. The method of claim 1 wherein the water vapor is introduced into the chamber after the fluorine containing gas.

8. The method of claim 1 wherein the water vapor is introduced into the chamber before the fluorine containing gas.

9. The method of claim 1 further including determining whether the chamber is coated with an unacceptable amount of deposits from previous use, and performing the steps of claim 1 if such amount of deposits is determined to be present.

10. The method of claim 1 wherein the water vapor is produced in a vacuum bubbling chamber having an outlet connected to an inlet of the vacuum plasma processing chamber.

11. The method of claim 1 wherein the water vapor is derived from an injector having an outlet connected to an inlet of the vacuum plasma processing chamber.

12. The method of claim 1 wherein there is a partial reaction in the chamber in accordance with at least one of:

$4H_2O + SF_6 \rightarrow H_2SO_4 + 6HF$, and $H_2O + NF_3 \rightarrow HNO_3 + HF$.

13. The method of claim 1 wherein substantially all of the HF gaseous reaction product is consumed in the reaction with the deposits so virtually no HF is pumped from the chamber.

14. A method of in situ removing deposits from interior surfaces forming a vacuum plasma processing chamber comprising causing water vapor and at least one of $NF_3$ and $SF_6$ gas to be in the chamber in vacuo in the presence of a plasma discharge to form vaporous reactants for the deposits, the vaporous reactants reacting with the deposits to form vaporous reaction products, and pumping the vaporous reaction products from the vacuum chamber in vacuo.

15. The method of claim 14 wherein the $SF_6$ is supplied without the $NF_3$.

16. The method of claim 14 wherein the $NF_3$ is supplied without the $SF_6$.

17. The method of claim 14 further including introducing vaporous $H_2O_2$ into the chamber simultaneously with the water vapor.

18. The method of claim 17 wherein the partial reactions of the $H_2O_2$ vapor and the at least one $NF_3$ and $SF_6$ are in accordance with at least one of $4H_2O_2 + SF_6 \rightarrow H_2SO_4 + 6HF + 2O_2$, and $H_2O_2 + NF_3 \rightarrow HNO_3 + HF + O_2$.

19. The method of claim 14 wherein the partial reactions of the water vapor and the at least one $NF_3$ and $SF_6$ are in accordance with at least one of:

$4H_2O + SF_6 \rightarrow H_2SO_4 + 6HF$, and $H_2O + NF_3 \rightarrow HNO_3 + HF$.

20. The method of claim 14 wherein HF is one of the formed vaporous reaction products, and substantially all of the HF vaporous reaction product is consumed in the reaction with the deposits so virtually no HF is pumped from the chamber.

* * * * *